(12) United States Patent
Tissot

(10) Patent No.: US 8,570,749 B2
(45) Date of Patent: Oct. 29, 2013

(54) AUXILIARY DEVICE FOR CONDUCTIVELY REMOVING THE HEAT PRODUCED BY AN ELECTRONIC CARD

(75) Inventor: Serge Tissot, Hyeres (FR)

(73) Assignee: Kontron Modular Computers S.A., Toulon Cedex (FR)

( * ) Notice: Subject to any disclaimer, the term of this patent is extended or adjusted under 35 U.S.C. 154(b) by 279 days.

(21) Appl. No.: 13/022,733

(22) Filed: Feb. 8, 2011

(65) Prior Publication Data

US 2012/0069526 A1 Mar. 22, 2012

(30) Foreign Application Priority Data

Feb. 9, 2010 (FR) ...................................... 10 00525

(51) Int. Cl.
  *H05K 7/20* (2006.01)
(52) U.S. Cl.
  USPC ................. 361/720; 361/679.47; 361/679.54; 361/710; 361/760; 174/548
(58) Field of Classification Search
  USPC .................. 361/676–678, 679.46–679.54, 361/688–690, 701–704, 707, 709–710, 361/717–720, 760
  See application file for complete search history.

(56) References Cited

U.S. PATENT DOCUMENTS

| | | | | | |
|---|---|---|---|---|---|
| 4,867,235 | A | * | 9/1989 | Grapes et al. | 165/185 |
| 5,262,587 | A | * | 11/1993 | Moser | 174/15.1 |
| 6,765,798 | B1 | * | 7/2004 | Ratliff et al. | 361/704 |
| 7,193,850 | B2 | * | 3/2007 | Pal | 361/700 |
| 7,787,249 | B2 | * | 8/2010 | Sundstrom | 361/714 |
| 8,174,828 | B2 | * | 5/2012 | Tilton et al. | 361/689 |
| 8,223,497 | B2 | * | 7/2012 | Sundstrom et al. | 361/707 |
| 2006/0044760 | A1 | | 3/2006 | Pal | |
| 2006/0109631 | A1 | * | 5/2006 | Marro et al. | 361/718 |
| 2006/0146496 | A1 | * | 7/2006 | Asfia et al. | 361/700 |
| 2008/0019102 | A1 | * | 1/2008 | Yurko | 361/719 |
| 2010/0002395 | A1 | * | 1/2010 | Bertrou et al. | 361/700 |
| 2011/0141692 | A1 | * | 6/2011 | Bult | 361/700 |
| 2011/0267776 | A1 | * | 11/2011 | Porreca et al. | 361/694 |

FOREIGN PATENT DOCUMENTS

| | | |
|---|---|---|
| EP | 2061296 A1 | 5/2009 |
| FR | 2907634 A1 | 4/2008 |
| FR | 2925254 A1 | 6/2009 |
| FR | 2929070 A1 | 9/2009 |

* cited by examiner

*Primary Examiner* — Courtney Smith
(74) *Attorney, Agent, or Firm* — Baker & Hostetler LLP

(57) ABSTRACT

An auxiliary device for conductively removing the heat produced by one or more components on an electronic card includes a heat sink covering all or part of the card. The device includes at least a first heat-conducting element mounted to absorb the heat produced by the one or more components, a movable second heat-conducting element, a heat pipe connecting the first element with the second element, and clamping means designed to press the movable second element against a cold wall.

18 Claims, 3 Drawing Sheets

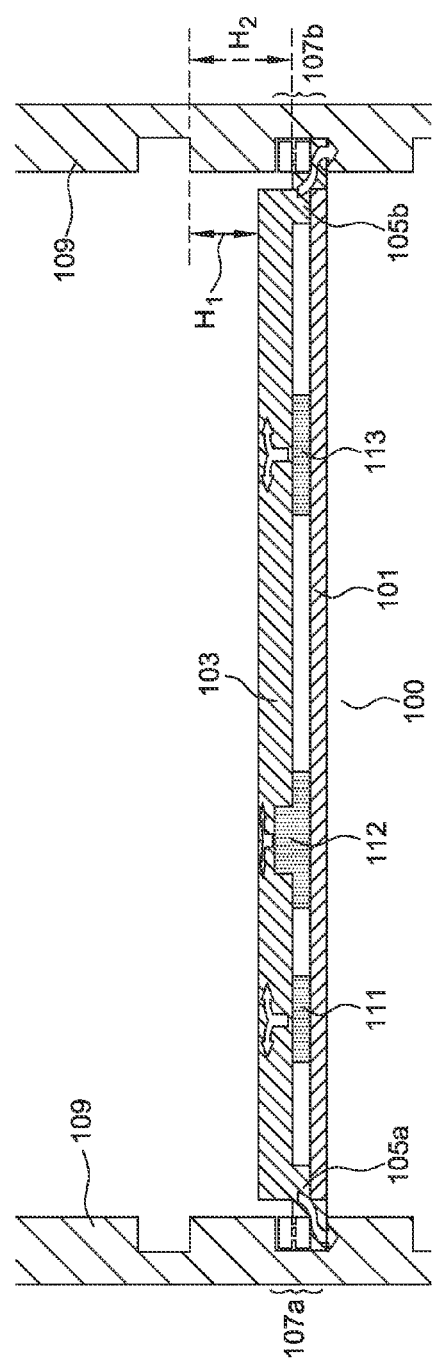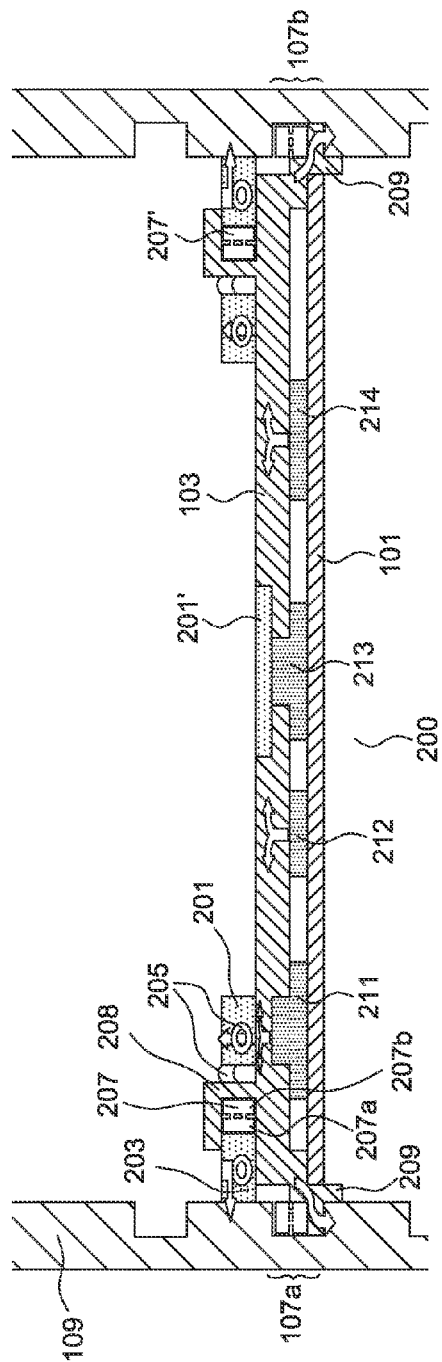

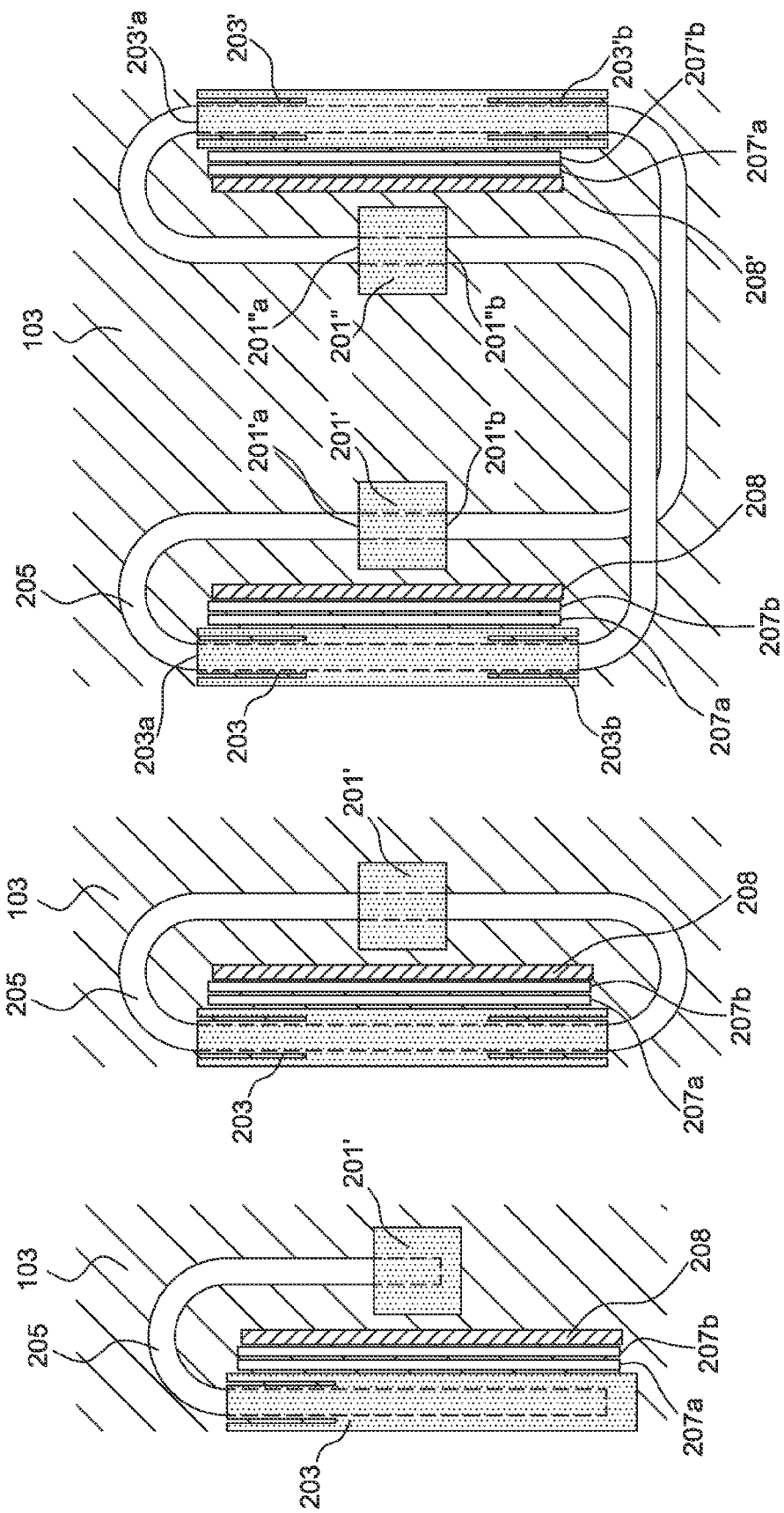

AUXILIARY DEVICE FOR CONDUCTIVELY REMOVING THE HEAT PRODUCED BY AN ELECTRONIC CARD

CROSS-REFERENCE TO RELATED APPLICATION

This application claims priority to foreign French patent application No. FR 10 00525, filed on Feb. 9, 2010, the disclosure of which is incorporated by reference in its entirety.

FIELD OF THE INVENTION

The present invention relates to an auxiliary device for conductively removing the heat produced by an electronic card. The present invention is applicable, for example, to cooling of modular computers having a plurality of conductively-cooled removable electronic cards.

BACKGROUND OF THE INVENTION

Electronic cards are subject to interconnection standards or specifications that define, in three dimensions, the size of the cards and the slots into which these cards are inserted. These size constraints prevent production of elongate thermal slots that are thicker, or multiple, which would optimize heat exchange between the card and the frame.

Various elements can be used to cool an electronic card and its components by heat conduction. For example, it is possible to attach a heat sink to all or part of the electronic card, so as to remove the heat produced by the card to the outside such as the frame in which the electronic card may be fitted.

An electronic card generally has spots having a higher temperature than the rest of the card. These hot spots generally correspond to the locations of certain components, for example processors. To improve the removal of heat from these hot spots, it is possible to use heat pipes. The latter are long cylinders, often made of a metal (for example of copper or aluminum), that contain a fluid such as water. This water is in equilibrium between its gaseous phase and its liquid phase in the absence of any other gas. In the portion of the heat pipe near the component to be cooled, the water is heated and vaporizes, thereby storing energy from the heat emitted by this component. This gas then ascends the heat pipe and arrives near a cooling system where it is cooled until it condenses to become a liquid once more, releasing energy to the ambient air in the form of heat.

French patent application number FR 2 925 254 provides a cooling device, for an electronic card, using heat pipes. This device removes the heat produced by electronic components on the card and transfers this heat to points of contact between the card and the slot of the frame into which the card is inserted.

However, this device has a number of drawbacks. Firstly, the heat exchange area available between the card and the frame is limited by the standardized size of the slot. Also, it is not meant for optional installation. In other words, it cannot be installed on a card equipped with a standard heat sink, and once the device is installed on a card it is not possible to remove it without having to once more modify the heat sink associated with the card or the frame into which the card is inserted. Additionally, this device does not guarantee independent pathways of heat removal to the cold spot.

SUMMARY OF THE INVENTION

The invention provides an improved means of removing the heat produced by an electronic card whilst preserving its removable character and respecting the specification-imposed size constraints. Specifically, for example, one embodiment of the invention provides an auxiliary device for conductively removing the heat produced by one or more components on an electronic card, the device including a heat sink covering all or part of the card, mounted in at least one slot formed in a frame external to the card, the frame forming a cold wall, the device including at least a first heat-conducting element mounted to absorb the heat produced by one or more components, and a heat pipe connecting the first element with a second heat-conducting element. The heat pipe is placed in a plane substantially parallel and external to the heat sink, the heat pipe has a flexibility that allows the second heat-conducting element to move, and the device includes a clamping means designed to press the movable second element against a portion of the cold wall that is situated away from the slot.

The clamping means may comprise include two parts able to move relative to each other, a first part being fixed to the second heat-conducting element, a second part being held stationary relative to the heat sink.

According to another embodiment, the device includes, on the heat sink, securing means designed to hold the clamping means and the second heat-conducting element in place when the second conducting element is being clamped against the cold wall.

According to yet another embodiment, the first heat-conducting element, the second heat-conducting element and the heat pipe are formed from one and the same element.

According to still another embodiment, the first heat-conducting element are/is a block of conducting material bonded to one side of the heat sink near a hot spot.

At least the second heat-conducting element may also be a cap closing off an aperture formed in the heat sink, the cap being placed in contact with a hot spot of the electronic card.

According to another embodiment, the heat pipe is U-shaped in a plane parallel to the plane formed by the heat sink, the first end of the U being connected to the first conducting element, the second end of the U being connected to the second conducting element.

According to still another embodiment, the heat pipe forms a closed loop in contact with the first heat-conducting element and the second heat-conducting element.

According to yet another embodiment, the heat pipe connects a first conducting element mounted near a first hot spot to a second conducting element mounted near a cold wall, the heat pipe connects the second conducting element to a third conducting element mounted near a second hot spot, the third conducting element to a fourth conducting element mounted near a cold wall, the fourth element being connected by the heat pipe to the first conducting element.

Another embodiment of the invention includes a conductively cooled electronic card having the device described above.

The invention may be used in addition to any cooling device already installed; it allows more heat to be removed whilst being compatible with the standardized slots present in frames for electronic cards. It makes use of the relative flexibility of the heat pipe in order to be able, in a first step, to insert the electronic card provided with the device according to the invention into a frame, and then, in a second step, to actuate the clamping means to form an auxiliary pathway for heat removal from the hot spot to the cold wall.

In exemplary embodiments, the auxiliary, parallel, heat removal pathway allows the card to be better cooled by reducing the thermal resistance between the card and the cold wall, despite the difficulty increasing the heat exchange area between the heat sink and the cold wall due to the standardization of the dimensions of the base devices.

The exemplary embodiments are optionally mounted, e.g., enabling the card and the heat sink to be easily mounted and removed. It is thus possible to conceive of a number of nonlimiting examples in which the electronic card could be used: a first context in which the device according to the invention is not necessary and a second context in which certain components are hotter and should benefit from an additional heat removal pathway. Moreover, the device may be installed for various card formats. The process for manufacturing and storing products using electronic cards is thus simplified.

The present invention also preserves the independence of the various heat removal pathways for all the pathways, i.e. from the hot spots to the cold wall. Thus, in contrast to prior-art devices in which heat from a hot spot is transferred, at the condenser of the heat pipe, to the heat sink, consequently heating the other elements of the electronic card, the present invention allows the heat from a component to be transferred independently to a cold wall.

The present invention may used in the context of a preheating system for an electronic component, by modifying the device disclosed in the published French patent application number FR 2 929 070. This is because, in a very cold environment, a resistance heater may be placed so as to raise the temperature of the assembly formed by the heat pipe, the first heat-conducting element and the component, without however transmitting heat to the electronic card assembly. The resistance heater may then be placed on the cold wall, and no longer on the electronic card, making the design of the preheating device and its power supply easier.

Moreover, exemplary embodiments provide benefits from good heat transfer performance thanks, on the one hand, to a potentially large area for heat exchange with the cold wall and, on the other hand, to the presence of a single thermal interface at the condenser of each cooling pathway (the interface being the boundary between the second heat-conducting element and the cold wall).

BRIEF DESCRIPTION OF THE DRAWINGS

Additional aspects, features and advantages of the present invention will become more readily apparent upon reading the following nonlimiting detailed description, given by way of example, with reference to the accompanying drawings, in which:

FIG. 1 is a cross section of an electronic card surmounted by a heat sink without the device according to the invention;

FIG. 2 is an electronic card equipped with the cooling device according to the invention;

FIGS. 4a, 4b and 4c, illustrate a number of possible configurations associating heat-conducting caps and bars and a heat pipe of the device according to the invention.

DETAILED DESCRIPTION

Figure 3A:
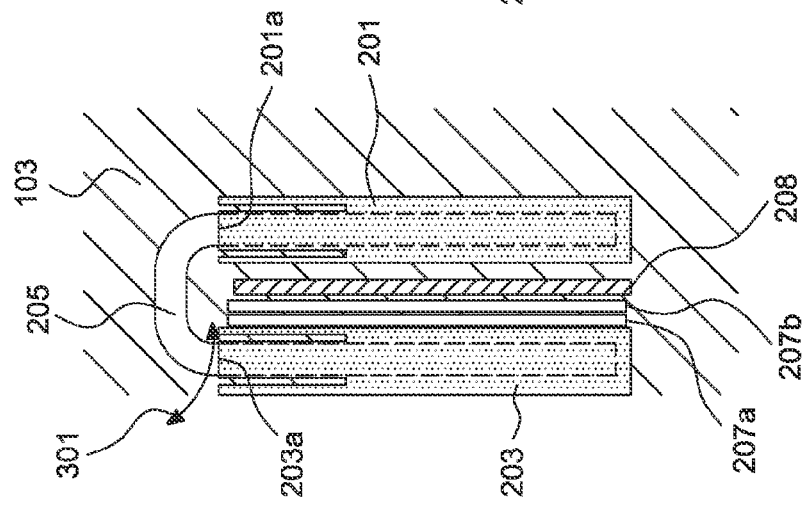
FIGS. 3a, 3b and 3c illustrate a number of possible configurations associating heat-conducting bars and a heat pipe of the device according to the invention.

FIG. 1 shows a cross section of an electronic card surmounted by a heat sink without the device according to the invention. The electronic card 100 comprises a printed circuit board 101 and a plurality of components 111, 112, 113 forming hot spots. A heat sink 103, which in the example is designed especially for the electronic card 100, is mounted above components 111, 112, 113 so as to absorb the heat dissipated by them. At the edges 105a, 105b of the electronic card, the heat sink 103 makes contact with the slots 107a, 107b of the frame 109 into which the card 100 is inserted.

FIG. 2 shows an electronic card equipped with the cooling device according to the invention. The device comprises a first heat-conducting element 201, a second heat-conducting element 203, a heat pipe 205 connecting the two heat-conducting elements 201, 203, and clamping means 207.

The first heat-conducting element 201 is bonded to that side of the heat sink 103 which is opposite the side in contact with the components 111, 112, 113 of the card 100. The first heat-conducting element 201 is held pressed against the heat sink 103, near a hot spot, for example above a component 211. The first heat-conducting element 201 may, for example, be a metal bar screwed into the heat sink 103 or held by a sprung device. The clamping must ensure good thermal conduction between the conducting element 201 and the hot spot.

According to another embodiment, and illustrated in FIG. 2, the first heat-conducting element 201' is placed directly in contact with the hot spot—for example, on a component 213. A heat-conducting element 201, 203 may be a block, for example a solid metal parallelepiped 201, 203, whether this element is a bar 201 attached to the heat sink 103, or takes the form of a cap 201' closing off an aperture formed in the heat sink 103, the cap 201' then making direct contact with the hot spot 213. Whether a bar 201 or a cap 201' is chosen depends notably on the shape of and thermal density uniformity in the region to be cooled. In the case of an isolated component requiring a specific cooling pathway, the cap 201', making direct contact with the component, is preferred.

The heat absorbed by the first heat-conducting element 201 must then be removed, the heat pipe 205 being used for this purpose. The heat pipe 205 may a tube of rectangular cross section curved so as to connect the two heat-conducting elements 201, 203. For example, the heat pipe 205 is curved in a plane parallel to the heat sink 103, the long side of the tube being positioned in a plane orthogonal to the plane of curvature. Thus the assembly, formed by the printed circuit board 101, the components 211, 212, 213, the heat sink 103 and the device according to the invention, does not exceed the maximum permitted height of the gaps between electronic cards. By way of illustration, the height $H_1$ between the top side of the heat sink 103 and the bottom side of the slot corresponding to the gap located above the electronic card 100 may be equal to about 5 mm, the height $H_2$ between the bottom side of the heat sink 103 and the bottom side of the same slot being, for example, equal to 10 mm. The heat pipe 205 conducts heat from the hot spot 211 and transmits to the first heat-conducting element 201 toward the second heat conduction element 203. According to one embodiment of the device according to the invention, the first heat-conducting element 201, the heat pipe 205, and the second heat-conducting element 203 are just one and the same shaped piece of material. An advantage of having only one piece of material is that it avoids the presence of thermal interfaces between the heat pipe 205 and the conducting elements 201, 203, these interfaces leading to heat losses. The second heat-conducting element 203 is placed at an edge of the electronic card 200, near a cold wall, in the example the frame 109, so that it presses the second heat-conducting element 203 against the cold sidewall 109, a heat exchange surface being created.

The heat pipe 205 benefits, depending on the material from which it is made, its length and the shape given to it, from a certain flexibility that allows the second heat-conducting element 203 to move. In the example, the second heat-conducting element 203 may move slightly in a plane parallel to the heat sink 103 and along an axis that substantially connects the two conducting elements 201, 203. Furthermore, the clamping means 207 are placed against the side, of the second conducting element 203, opposite the cold wall 109. The clamping means 207 comprise for example a wedge lock system, this type of system comprising two parts able to move relative to each other, these two parts being moved apart for example by turning a locking screw. In the example, a first part 207a of the wedge lock is attached to the second heat-conducting element 203 and a second part 207b of the wedge lock is held stationary relative to the heat exchange 103, for example using a stop 208. The stop 208 may be formed on the heat sink 103 so as to hold the clamping means 207 and guide the second heat-conducting element 203 onto the desired axis of movement.

Associating the clamping system 207 with the movable second conducting element 203 allows the device according to the invention to take at least two different positions: an open position in which the two movable parts 207a, 207b of the clamping means 207 are brought closer together, the second conducting element 203 then being separated from the cold wall 109, and a locked position in which the two parts 207a, 207b of the wedge lock are separated, the second conducting element 203 then being pressed against the cold wall 109 in order to complete the heat removal pathway.

Thus, installing the device according to the invention on an electronic card may be carried out with the following steps:
  install the assembly comprising the first conducting element 201, the heat pipe 205, the second conducting element 203 and the clamping means 207 on the heat sink 103 by attaching the first conducting element 201 to the heat sink 103 and by securing the clamping means against the stop 208;
  actuate the clamping means 207 so as bring the two movable parts 207a, 207b closer together;
  insert the electronic card 200 equipped with the heat sink 103 and with the device according to the invention into the slots 107a, 107b of the frame 109; and
  actuate the clamping means 207 so as to move the two movable parts 207a, 207b apart so as to press the second conducting element 203 against the cold wall, i.e. the frame 109.

In an embodiment, a protuberance 209 may be formed in the heat sink 103 at the ends near the slots 107a, 107b in order to prevent the card 200 from being moved, by way of a counteraction, in the opposite direction to the direction in which the first movable part 207a of the wedge lock is moved; the protuberance 209 thus secures the electronic card during the locking of the clamping means 207.

Furthermore, when a plurality of devices according to the invention are installed on opposite edges of the same electronic card 200, for example when it is desired to remove the heat produced by a plurality of processors generating a lot of heat, it is preferable to lock the clamping means 207, 207' in parallel and not sequentially, so as to prevent damaging the frame 109 with unbalanced clamping.

In another embodiment of the device according to the invention, the first heat-conducting element 201, 201' may be integrated into the heat sink 103. Moreover, the first half 207a of the wedge lock 207 may be integrated into the second heat-conducting element 203 in order to reduce the number of movable parts and make mounting the device easier.

Figure 3B:
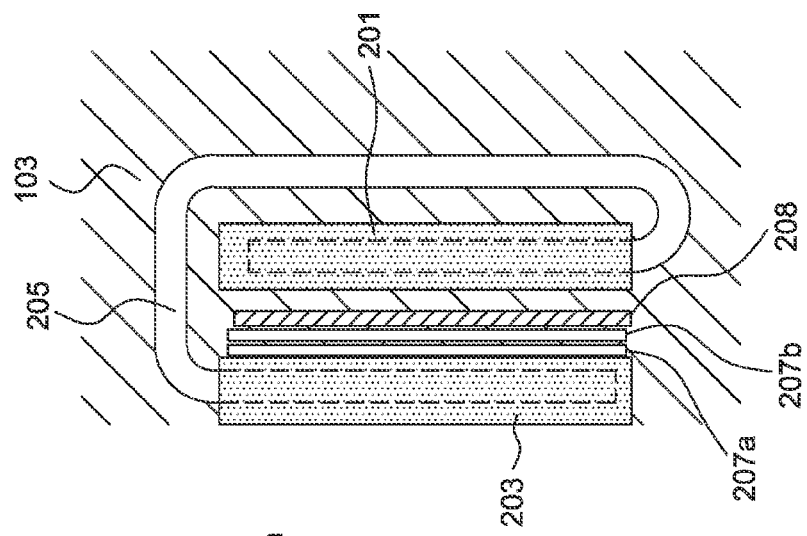
Figure 3C:
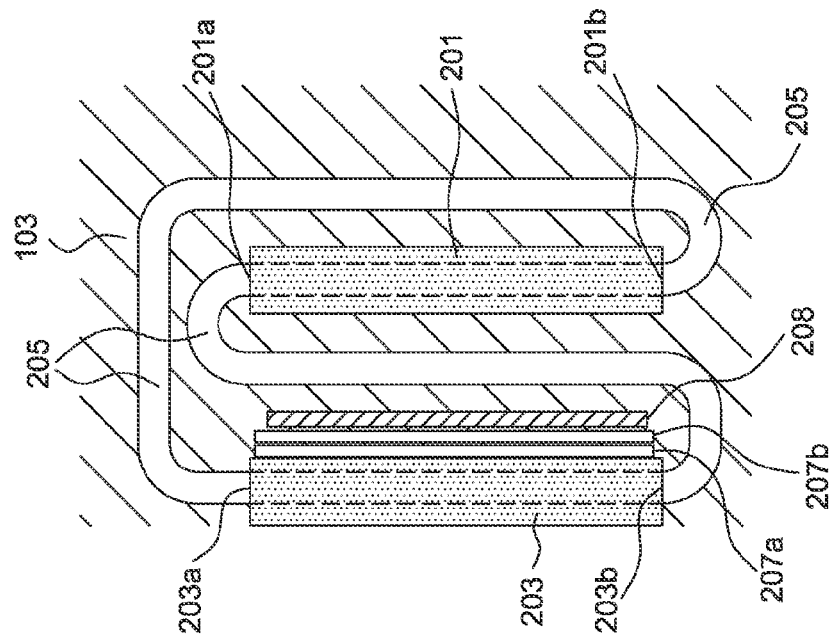

FIGS. 3a, 3b and 3c show a number of possible configurations associating heat-conducting bars and a heat pipe of the device according to the invention. In FIGS. 3a, 3b and 3c, the first and second heat-conducting elements 201, 203 are metal bars seen from above.

FIG. 3a shows a first configuration in which the bars 203 are connected by a short length of heat pipe 205 in the shape of a U and parallel to the plane of the heat sink 103. Each end of the heat pipe 205 is fitted into a bar 201, 203, so as to allow, by virtue of the flexibility of the heat pipe 205, the bar 203, bonded to the wedge lock 207 and to the heat pipe 205, to move somewhat, as indicated by the arrow 301. For example, a small empty space may be left between the heat pipe 205 and each of the bars 201, 203, at the ends 201, 203a of the bars, so as to leave a clearance around the heat pipe 205. This configuration notably has the advantage of simplicity.

FIG. 3b shows a second configuration in which the heat pipe 205 is longer than in the first configuration. This configuration notably has the advantage that the heat pipe 205 is more flexible, by virtue of its greater length.

FIG. 3c shows a third configuration in which the heat pipe 205 passes through each of the bars 201, 203. In the example, the heat pipe 205 connects the first end 201a of the first bar 201 to the second end 203b of the second bar 203 and the first end 203a of the second bar 203 to the second end 201b of the first bar 201, the heat pipe 205 passing through said bars 201, 203 in order to optimize heat exchange. This configuration notably has the advantage of being more independent of gravity, or any other acceleration force, than the first and second configuration and thus makes the movement of the fluid droplets contained in the heat pipe 205 toward an evaporator (hot spot) easier. This configuration may be useful when the card is subject to acceleration, for example if it is airborne.

The three configurations illustrated in FIGS. 3a, 3b and 3c may easily be modified for heat exchange using caps rather than bars.

FIGS. 4a, 4b and 4c show a number of possible configurations associating heat-conducting caps and bars and a heat pipe of the device according to the invention.

FIG. 4a shows a fourth configuration in which the first conducting element is a cap 201' and the second conducting element is a bar 203. One end of the cap 201' and one end of the bar 203 are connected by a heat pipe 205. Like the first configuration illustrated in FIG. 3a, this configuration has the advantage of simiplicity.

FIG. 4b shows a fifth configuration in which the first conducting element is a cap 201' and the second conducting element is a bar 203. A heat pipe 205 passes through the bar 203 and is bonded to the cap 201', so as to make a loop. This configuration operates better when the device is subject to acceleration.

FIG. 4c shows a sixth configuration comprising two caps 201', 201" and two bars 203, 203'. Each bar 203, 203' is placed against a cold wall and each cap 201', 201" is placed on a hot spot. The first end 201'a of the first cap 201' is connected to the first end 203a of the first bar 203, the second end 203b of the first bar being connected to the second end 201"b of the second cap 201", the first end 201"a being connected to the first end 203a' of the second bar 203', the second end 203b' of the second bar 203' being connected to the second end 201b' of the first cap 201'. This sixth configuration allows problems with acceleration or gravity to be better overcome, notably when the direction of acceleration or gravity is perpendicular to the slots and in the plane of the heat sink 103: if the transfer of heat to the cold wall against which the first bar 203 is placed is opposed by the acceleration, the transfer of heat to the cold wall against which the second bar 203' is placed will be increased, and vice versa.

The device according to the invention is an auxiliary means for removing heat that can be employed to supplement the cooling provided by the heat sink 103. It may be installed on electronic cards of various sizes. For example, it may be placed on an 6U electronic card of width=233.5 mm or on a 3U card of width=100 mm.

The device according to the invention is well suited to the new modular computer size standards, which tend to increase the distance available between two consecutive card slots. Notably, the device according to the invention may advantageously be employed in the context of the VPX (VITA-46) standard, VITA being an acronym for VME International Trade Association. VITA-46 is the name of a standard developed by VITA.

What is claimed is:

1. An auxiliary device for conductively removing heat produced by one or more components on an electronic card mounted in at least one slot formed in a frame external to said electronic card, said frame forming a cold wall, the auxiliary device comprising:
   a heat sink covering all or part of said electronic card;
   at least a first heat-conducting element mounted to absorb the heat produced by the one or more components; and
   a heat pipe connecting said first heat-conducting element with a second heat-conducting element, wherein
   the heat pipe is placed in a plane substantially parallel and external to the heat sink,
   the heat pipe has a flexibility that allows the second heat-conducting element to move,
   the device further comprises clamping means to press the movable second heat-conducting element against a portion of said cold wall that is located away from said slot,
   the clamping means is operable to exert a clamping force in a direction substantially perpendicular to the portion of the cold wall that is located away from the slot, and
   the clamping means comprises a first part and a second part configured to move relative to each other, the first part being fixed to the second heat-conducting element, and the second part being held stationary relative to the heat sink.

2. The device as claimed in claim 1, comprising, on the heat sink, securing means designed to hold the clamping means and the second heat-conducting element in place when said second heat-conducting element is clamped against the cold wall.

3. The device as claimed in claim 1, wherein the first heat-conducting element, the second heat-conducting element, and the heat pipe are formed from one and the same element.

4. The device as claimed in claim 1, wherein the first heat-conducting element is a block of conducting material bonded to one side of the heat sink near a hot spot.

5. The device as claimed in claim 1, wherein at least one heat-conducting element is a cap closing off an aperture formed in the heat sink, said cap being placed in contact with a hot spot of the electronic card.

6. The device as claimed in claim 1, wherein the heat pipe includes a U-shape in a plane parallel to a plane formed by the heat sink, a first end of the U-shape being connected to the first heat-conducting element, the second end of the U-shape being connected to the second heat-conducting element.

7. The device as claimed in claim 1, wherein the heat pipe forms a closed loop in contact with the first heat-conducting element and the second heat-conducting element.

8. The device as claimed in claim 1, wherein
   each of the first heat-conducting element and a third heat-conducting element is mounted near a hot spot,
   the second heat-conducting element and a fourth heat-conducting element are mounted near the cold wall,
   the heat pipe connects the first heat-conducting element to the second heat-conducting element,
   the heat pipe connects the second heat-conducting element to the third heat-conducting element,
   the heat pipe connects the third heat-conducting element to the fourth heat-conducting element, and
   the heat pipe connects said fourth heat-conducting element to the first heat-conducting element.

9. A conductively cooled electronic card comprising the device as claimed in claim 1.

10. A conductively cooled electronic card comprising the device as claimed in claim 2.

11. A conductively cooled electronic card comprising the device as claimed in claim 3.

12. A conductively cooled electronic card comprising the device as claimed in claim 4.

13. A conductively cooled electronic card comprising the device as claimed in claim 5.

14. A conductively cooled electronic card comprising the device as claimed in claim 6.

15. A conductively cooled electronic card comprising the device as claimed in claim 7.

16. A conductively cooled electronic card comprising the device as claimed in claim 8.

17. An auxiliary device for conductively removing heat produced by one or more components on an electronic card mounted in at least one slot formed in a frame external to said electronic card, said frame forming a cold wall, the auxiliary device comprising:
   a heat sink covering all or part of said electronic card;
   at least a first heat-conducting element mounted to absorb the heat produced by the one or more components; and
   a heat pipe connecting said first heat-conducting element with a second heat-conducting element, wherein
   the heat pipe is placed in a plane substantially parallel and external to the heat sink,
   the heat pipe has a flexibility that allows the second heat-conducting element to move,
   the device further comprises clamping means to press the movable second heat-conducting element against a portion of said cold wall that is located away from said slot,
   the clamping means is operable to exert a clamping force in a direction substantially perpendicular to the portion of the cold wall that is located away from the slot, and
   at least one heat-conducting element is a cap closing off an aperture formed in the heat sink, said cap being placed in contact with a hot spot of the electronic card.

18. An auxiliary device for conductively removing heat produced by one or more components on an electronic card mounted in at least one slot formed in a frame external to said electronic card, said frame forming a cold wall, the auxiliary device comprising:
   a heat sink covering all or part of said electronic card;
   at least a first heat-conducting element mounted to absorb the heat produced by the one or more components; and
   a heat pipe connecting said first heat-conducting element with a second heat-conducting element, wherein
   the heat pipe is placed in a plane substantially parallel and external to the heat sink,
   the heat pipe has a flexibility that allows the second heat-conducting element to move,
   the device further comprises clamping means to press the movable second heat-conducting element against a portion of said cold wall that is located away from said slot,
   the clamping means is operable to exert a clamping force in a direction substantially perpendicular to the portion of the cold wall that is located away from the slot,
   each of the first heat-conducting element and a third heat-conducting element is mounted near a hot spot,
   the second heat-conducting element and a fourth heat-conducting element are mounted near the cold wall, the heat pipe connects the first heat-conducting element to the second heat-conducting element,
the heat pipe connects the second heat-conducting element to the third heat-conducting element,
the heat pipe connects the third heat-conducting element to the fourth heat-conducting element, and
the heat pipe connects said fourth heat-conducting element to the first heat-conducting element.

\* \* \* \* \*